(12) United States Patent
Oganesian

(10) Patent No.: US 8,570,669 B2
(45) Date of Patent: Oct. 29, 2013

(54) MULTI-LAYER POLYMER LENS AND METHOD OF MAKING SAME

(75) Inventor: Vage Oganesian, Sunnyvale, CA (US)

(73) Assignee: Optiz, Inc, Palo Alto, CA (US)

(*) Notice: Subject to any disclaimer, the term of this patent is extended or adjusted under 35 U.S.C. 154(b) by 125 days.

(21) Appl. No.: 13/356,328

(22) Filed: Jan. 23, 2012

(65) Prior Publication Data

US 2013/0188267 A1 Jul. 25, 2013

(51) Int. Cl.
*G02B 3/08* (2006.01)
*G02B 9/00* (2006.01)
*B29D 11/00* (2006.01)

(52) U.S. Cl.
USPC ............... 359/741; 359/796; 264/1.1; 216/24

(58) Field of Classification Search
USPC .................. 359/741, 796; 264/1.1; 216/24
See application file for complete search history.

(56) References Cited

U.S. PATENT DOCUMENTS

| | | |
|---|---|---|
| 6,777,767 B2 | 8/2004 | Badehi |
| 6,972,480 B2 | 12/2005 | Zilber et al. |
| 7,033,664 B2 | 4/2006 | Zilber et al. |
| 7,157,742 B2 | 1/2007 | Badehi |
| 7,192,796 B2 | 3/2007 | Zilber et al. |
| 7,265,440 B2 | 9/2007 | Zilber et al. |
| 7,495,341 B2 | 2/2009 | Zilber et al. |
| 7,642,629 B2 | 1/2010 | Zilber et al. |
| 7,859,033 B2 | 12/2010 | Brady |
| 2004/0251525 A1 | 12/2004 | Zilber et al. |
| 2005/0104179 A1 | 5/2005 | Zilber et al. |
| 2005/0205977 A1 | 9/2005 | Zilber et al. |
| 2007/0138498 A1 | 6/2007 | Zilber et al. |
| 2007/0190691 A1 | 8/2007 | Humpston et al. |
| 2007/0190747 A1 | 8/2007 | Humpston et al. |
| 2008/0012115 A1 | 1/2008 | Zilber et al. |
| 2008/0017879 A1 | 1/2008 | Zilber et al. |
| 2008/0083976 A1 | 4/2008 | Haba et al. |
| 2008/0083977 A1 | 4/2008 | Haba et al. |
| 2008/0099900 A1 | 5/2008 | Oganesian et al. |
| 2008/0099907 A1 | 5/2008 | Oganesian et al. |
| 2008/0116544 A1 | 5/2008 | Grinman et al. |
| 2008/0116545 A1 | 5/2008 | Grinman et al. |
| 2008/0150121 A1 | 6/2008 | Oganesian et al. |
| 2008/0246136 A1 | 10/2008 | Haba et al. |
| 2009/0115047 A1 | 5/2009 | Haba et al. |
| 2009/0160065 A1 | 6/2009 | Haba et al. |
| 2009/0212381 A1 | 8/2009 | Crisp |
| 2010/0053407 A1 | 3/2010 | Crisp |

(Continued)

OTHER PUBLICATIONS

U.S. Appl. No. 13/157,193, filed Jun. 9, 2011, Oganesian, Vage.

(Continued)

*Primary Examiner* — William Choi
(74) *Attorney, Agent, or Firm* — DLA Piper LLP (US)

(57) ABSTRACT

A multi-layered lens having a substrate with opposing first and second surfaces. The substrate is formed of a plurality of discrete polymer layers. A cavity is formed into the first surface and is defined by a non-planar cavity surface that acts as a lens surface. The cavity extends into and exposes each of the plurality of polymer layers. The compositions of the polymer layers can vary to provide optimized focal properties. Alignment marks in the form of cavities or protrusions can be formed at the first surface or the second surface, so that multiple lenses can be stacked together in an aligned manner to form a stacked lens assembly.

32 Claims, 12 Drawing Sheets

(56) References Cited

U.S. PATENT DOCUMENTS

| | | |
|---|---|---|
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |
| 2012/0182623 A1* | 7/2012 | Wippermann et al. ........ 359/642 |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.

* cited by examiner

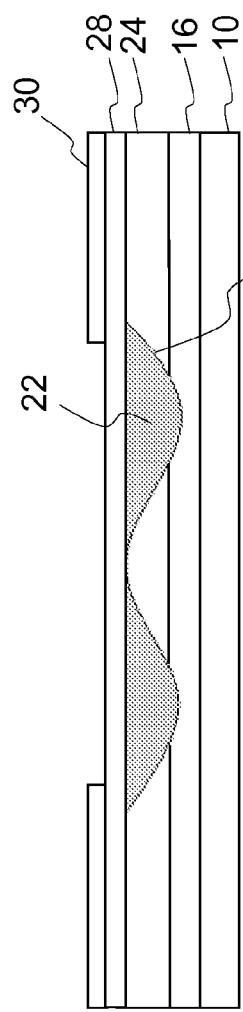
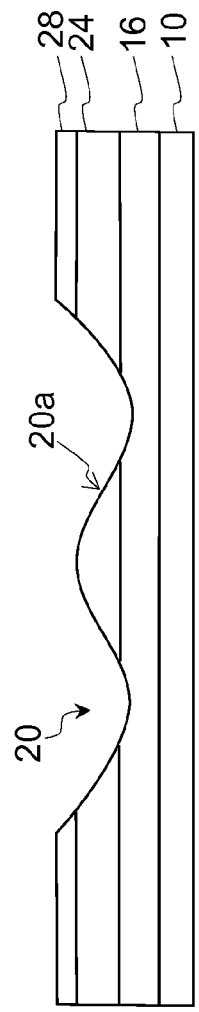
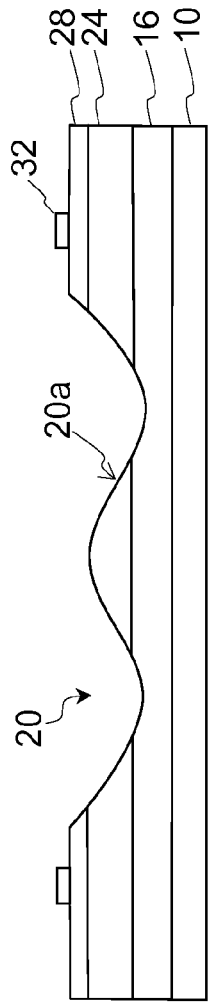

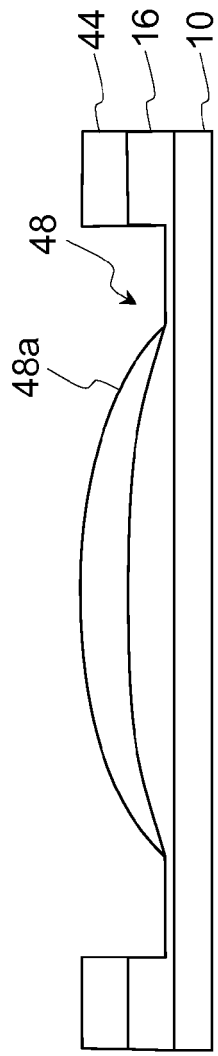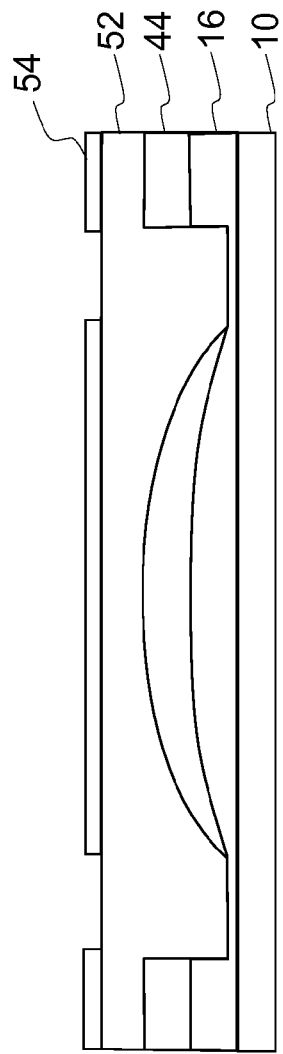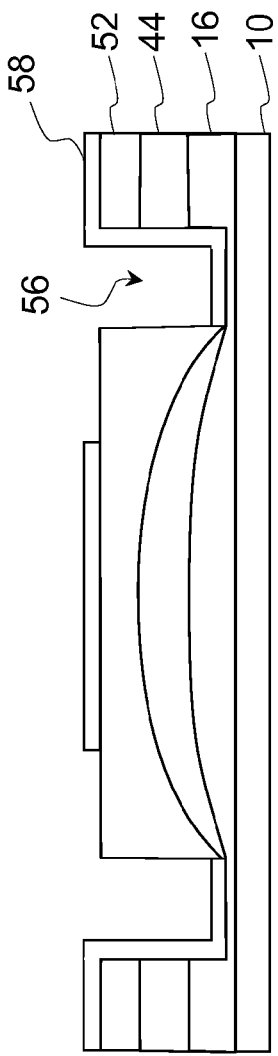

MULTI-LAYER POLYMER LENS AND METHOD OF MAKING SAME

FIELD OF THE INVENTION

The present invention relates to lenses, and more particularly to lenses used in mobile devices such as cell phone cameras.

BACKGROUND OF THE INVENTION

CMOS image sensor chips are typically used in mobile devices such as cell phone cameras to capture images (e.g. cell phone camera or video functionality). These image sensors are usually very small and compact, given the limited size and weight requirements for mobile devices. The image sensor chip includes one or more lenses that are used to focus the incoming light onto a light sensor. The light sensor converts the incoming light into electronic signals that represent the image formed by the incoming light.

Lenses are often made of glass or polymer, and are typically made using a molding process. For example, polymer lenses are typically manufactured using molding techniques such as stamping, injection molding and transfer molding. Injection molding, for example, involves injecting polymer in a liquid state into a mold cavity. The polymer is then cooled so that it solidifies in the shape of the mold. The polymer is then removed from the mold in the form of a lens.

Molded lenses are easily mass-produced. For example, pluralities of molds are simultaneously injected with fluid state material, then cooled, resulting in simultaneous formations of lenses. The quality of lenses needs to be high and consistent. However, as lenses get smaller and smaller, it has become harder to maintain quality with molded lenses because of the difficulty in forming multiple molds with exactly the same dimensions. Additionally, molds can fatigue over time and thus can produce lenses with declining quality over time. Lastly, injection molded lenses are monolithic, meaning that the possible optical properties achieved from molded lenses are limited. Multiple monolithic lenses can be stacked to achieve more varies optical properties, but with incrementally larger overall sizes and cost.

There is a need for an improved lens and manufacturing technique for making the lens that provides superior quality, uniformity and diverse optical performance over molded lenses, without adding significant cost.

BRIEF SUMMARY OF THE INVENTION

The aforementioned problems and needs are addressed by a multi-layered lens that includes a substrate having opposing first and second surfaces (wherein the substrate is formed of a plurality of discrete polymer layers), and a cavity formed into the first surface and including a non-planar cavity surface in the substrate, wherein the cavity extends into each of the plurality of polymer layers.

In another aspect of the present invention, a method of forming a lens includes forming a first polymer layer, forming a first cavity into a top surface of the first polymer layer, forming a second polymer layer on the top surface of the first polymer layer, and forming a second cavity into a top surface of the second polymer layer that extends through the second polymer layer to the first cavity, wherein the first and second cavities together include a non-planar cavity surface.

In yet another aspect of the present invention, a method of forming a lens includes forming a first polymer layer, forming a first cavity into a top surface of the first polymer layer, altering a shape of a sidewall of the first cavity, forming a second polymer layer on the top surface of the first polymer layer, forming a second cavity into a top surface of the second polymer layer, and altering a shape of a sidewall of the second cavity, wherein the second cavity includes a first non-planar cavity surface.

In still yet another aspect of the present invention, a lens assembly includes a plurality of lenses and a layer of material. Each of the plurality of lenses includes a substrate having opposing first and second surfaces and an outer edge, wherein the substrate is formed of a plurality of discrete polymer layers, and a cavity formed into the first surface and including a non-planar cavity surface in the substrate, wherein the cavity extends into each of the plurality of polymer layers. The plurality of lenses are stacked together such that adjacent ones of the plurality of lenses are affixed to each other by a bonding material. The layer of material extends around and between the outer edges of the substrates.

Other objects and features of the present invention will become apparent by a review of the specification, claims and appended figures.

BRIEF DESCRIPTION OF THE DRAWINGS

FIGS. 1A-1K are cross sectional side views showing in sequence the steps in forming the multi-layered lens.

DETAILED DESCRIPTION OF THE INVENTION

The present invention is a multi-layer lens, and the method of manufacturing the same. The number of layers, and the composition of each layer, can be varied to achieve the desired optical properties of the lens.

Figure 1A:

FIGS. 1A-1K illustrate the sequence of steps for manufacturing a multi-layer lens. In this example, the resulting lens will comprise three layers of material. The process begins by providing a smooth carrier 10 (e.g. Teflon), which is used as a lens carrier during the manufacturing process. As a non-limiting example, carrier 10 can be round (6 to 12 inches in diameter), with sidewalls 12 extending up from its upper surface 14 to contain the lens materials on the upper surface 14, as illustrated in FIG. 1A. While preferably a plurality of lenses are formed on carrier 10 simultaneously, for simplicity, the remaining figures illustrate the formation of a single lens on just a portion of carrier 10.

Figure 1B:
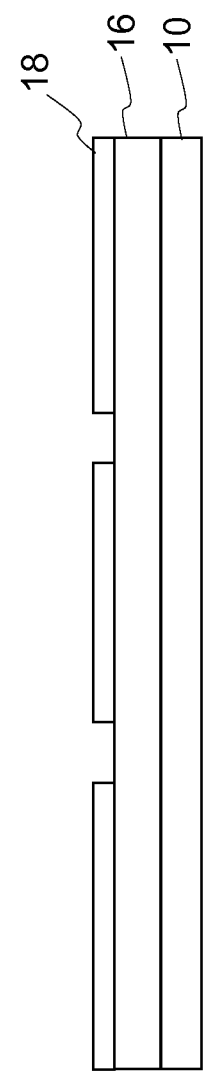

A first polymer layer 16 is formed on surface 10. Preferably, polymer formation is done by spray coating deposition, due to its even coating property. Polymer deposition is followed by a curing process. Polymer layer 16 can be epoxy silicone monomer, cycloaliphatic epoxy compounds, UV curable polymers, acrylate polymer, PMMA, COP, PC, ORNOCOMP or any other well-known optical polymer with desirable optical properties. A photo-resist layer 18 is formed over polymer layer 16, for example, by spray coating, spin coating or any other photo-resist deposition process (which are known in the art). The photo-resist layer is then patterned using a photo-lithography exposure and development process (which are all well known in the art), leaving portions of the polymer layer 16 exposed. The resulting structure is shown in FIG. 1B.

Figure 1C:
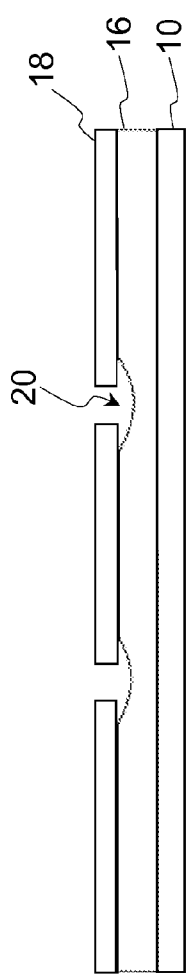

An isotropic etch process is next performed to selectively etch the exposed portions of polymer layer 16. For example, a wet isotropic etching process involving a wet bath of etch agent for the polymer of layer 16 can be used, which dissolves unprotected portions of layer 16 to create cavity 20 formed into the upper surface of layer 16 in the form of a ring around the optical area), as illustrated in FIG. 1C. The curvature of cavity 20 can be controlled by the pattern of photo-resist 18 and the etching solution used.

Figure 1D:
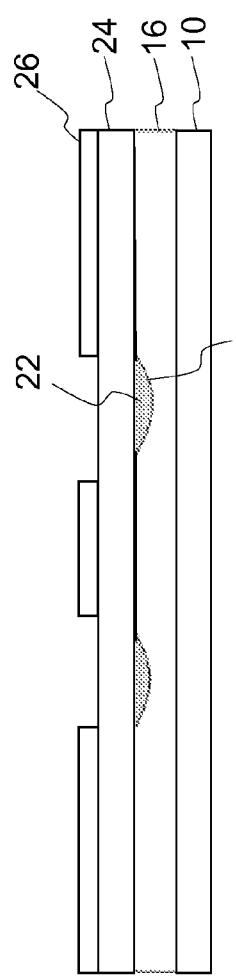

After photo-resist 18 is removed, the cavity 20 is filled with photo-resist 22. A second polymer layer 24 is then formed over polymer layer 16 (and photo-resist 22). Polymer layer 24 can be formed with the same material(s) or different material(s) (and same or different thickness) as polymer layer 16, depending upon the desired optical properties provided by itself and/or in combination of the other polymer layers. A photo-resist layer 26 is then formed over polymer layer 24, and patterned to expose portions of polymer layer 24 (in this example those portions disposed over photo-resist 22), as illustrated in FIG. 1D. Photo-resist 26 is different from (i.e. etch selective relative to) photo-resist 22.

Figure 1E:
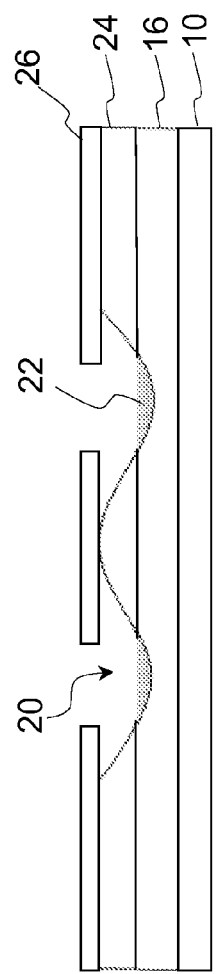

An isotropic etch process is next performed to selectively etch the exposed portions of polymer layer 24. For example, a wet isotropic etching process involving a wet bath of etch agent for the polymer of layer 24 can be used, which dissolves unprotected portions of layer 24 such that cavity 20 extends up through layer 24, as illustrated in FIG. 1E. The curvature and angle of the walls of cavity 20 as they extend through layer 24 can be controlled by the thickness of polymer layer 24, the pattern of photo-resist 26 and the etching solution used.

After photo-resist 26 is removed, the cavity 20 (as expanded through layer 24) is filled with photo-resist 22. A third polymer layer 28 is then formed over polymer layer 24 (and photo-resist 22). Polymer layer 28 can be formed with the same material(s) or different material(s) (and same or different thickness) as polymer layers 16 and/or 24, depending upon the desired optical properties provided by itself and/or in combination of the other polymer layers. A photo-resist layer 30 is then formed over polymer layer 28, and patterned to expose portions of polymer layer 28 that are disposed over photo-resist 22, as illustrated in FIG. 1F. Photo-resist 30 is different from (i.e. etch selective relative to) photo-resist 22.

An isotropic etch process is next performed to selectively etch the exposed portions of polymer layer 28. For example, a wet isotropic etching process involving a wet bath of etch agent for the polymer of layer 28 can be used, which dissolves unprotected portions of layer 28 (i.e. leaving cavity 20 extending up through layer 28). The curvature and angle of the walls of cavity 20 as they extend through layer 28 can be controlled by the thickness of polymer layer 28, the pattern of photo-resist 30 and the etching solution used. Photo-resist 30 and 22 are then removed, leaving the structure illustrated in FIG. 1G. In this example, cavity 20 is no longer in the shape of a ring, but is now circular with a non-planar cavity surface 20a that extends through (i.e. is defined by) all three polymer layers 16, 24 and 28. The cavity surface 20a defines the lens surface as further explained below.

A soft isotropic etch can be performed to smooth out any roughness on the cavity surface 20a, as well as any steps or gaps between polymer layers 16/24/28 along the cavity surface 20a. A similar optional surface polishing may be performed on the lens backside (i.e. the bottom surface of polymer layer 16 abutting carrier 10 after removal from the carrier 10).

Surface 20a can be optionally coated with an IR coating, which can include Copper (Cu), Gold, Hafnium Oxide (HfO2), ITO (Indium Tin Oxide), Magnesium Oxide (MgO), Nickel (Ni), Silicon Monoxide (SiO), Silver, Titanium Dioxide (TiO2), Tantalum Oxide (Ta2O5), Zirconium Oxideany and/or any other appropriate IR coating material. The IR coating can be applied using standard deposition techniques which are well known in the art. Similarly, the back surface (i.e. bottom surface of polymer layer 16 abutting the carrier 10) can be optionally coated with an AR coating (after removal from the carrier 10) using antireflection materials that are well known in the art.

Figure 1I:
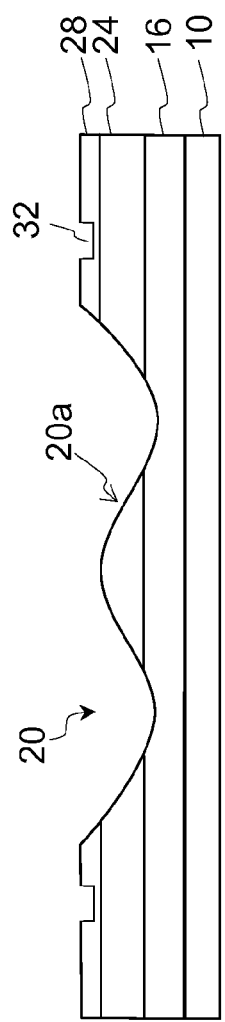

Alignment marks are then formed on or in the top surface of polymer layer 28. If the alignment marks 32 are formed on the polymer layer 28 top surface (as shown in FIG. 1H), they can be formed with a polymer, an epoxy, a resin, a metal, etc. as a protrusion that preferably extends from the polymer layer 28 top surface with a height of at least 3 μm. If the alignment marks 32 are formed into the polymer layer 28 top surface (as shown in FIG. 1I), they can be formed as a cavity or trench using a laser preferably having a depth of at least 3 μm. Alignment marks can have any desired shape, such as for example circular, rectangular, cross shaped, T-shaped, etc. Alignment marks 32 can additionally or alternately be formed on or in the bottom surface of polymer layer 16.

Figure 1J:
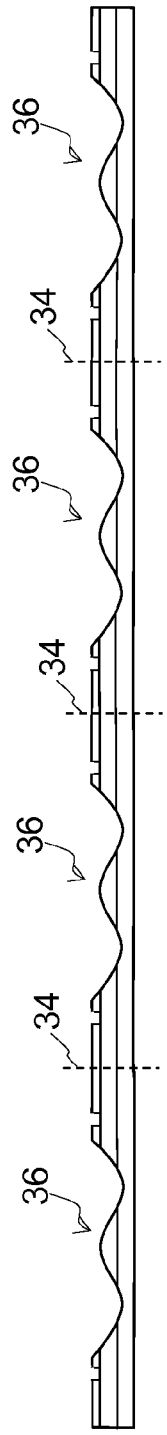
Figure 1K:
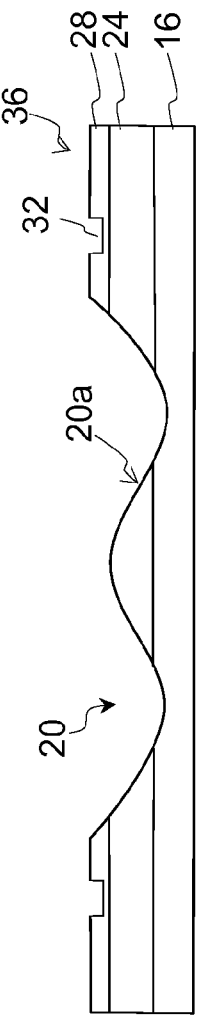

The carrier 10 is then removed, and the structure is then diced along dicing lines 34 as illustrated in FIG. 1J to separate each individual lenses 36. The final lens 36 is illustrated in FIG. 1K.

Lens 36 is a substrate formed of discrete layers of polymer material. Lens 36 includes a lens surface 20a having a very specific shape in order to produce the desired optical focusing for light passing through lens 36. The shape of lens surface 20a can be consistently and precisely controlled using the polymer deposition, photo-lithography and etch processes described above. By varying the compositions of the three layers 16, 24 and 28 relative to each other, as well as optionally continuing to add additional discrete layers to the three described above in a similar manner, more complex and diverse optical focusing performance can be achieved.

Figure 2A:
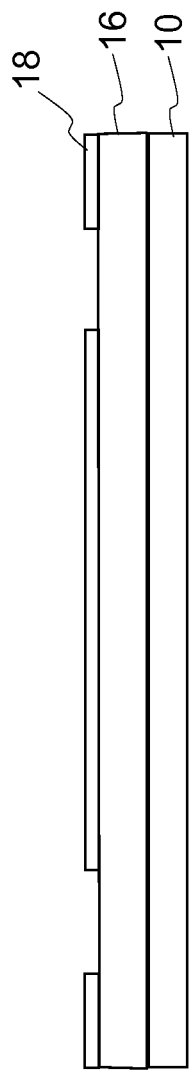
FIGS. 2A-2N are cross sectional side views showing in sequence the steps in forming an alternate embodiment of the multi-layered lens.
Figure 2B:
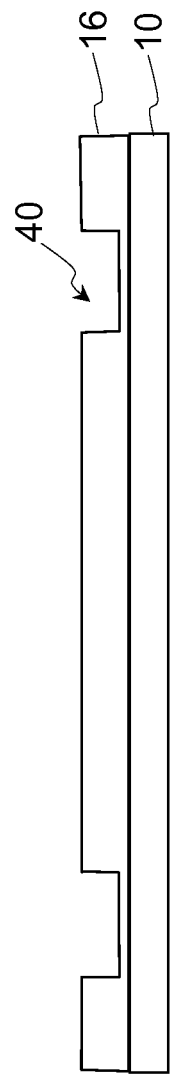
Figure 2C:
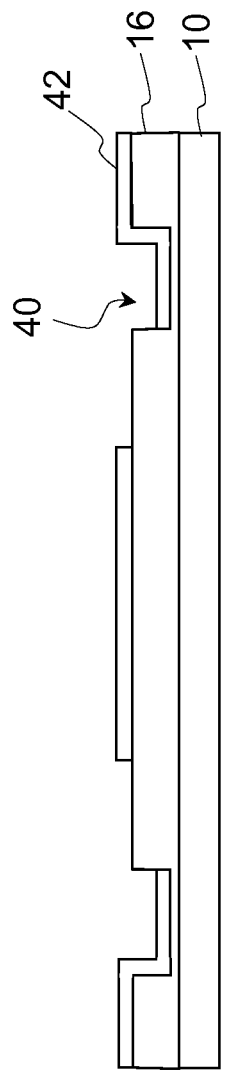
Figure 2D:
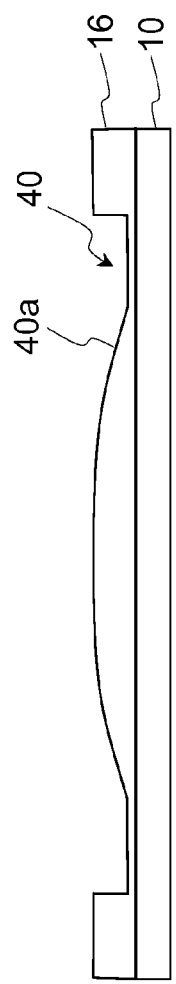
Figure 2E:
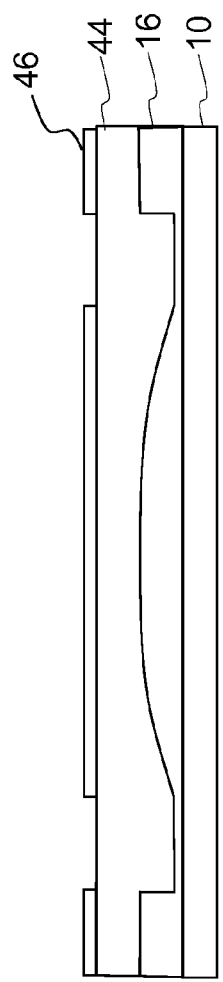
Figure 2F:
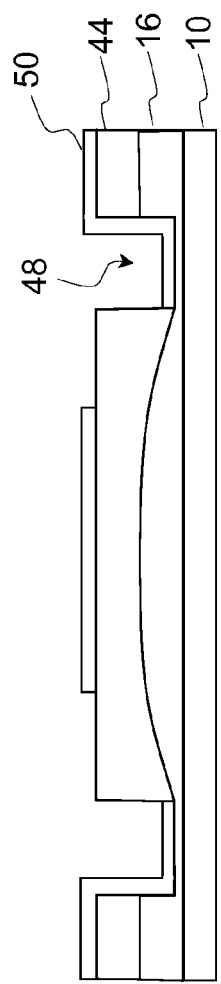
Figure 2J:
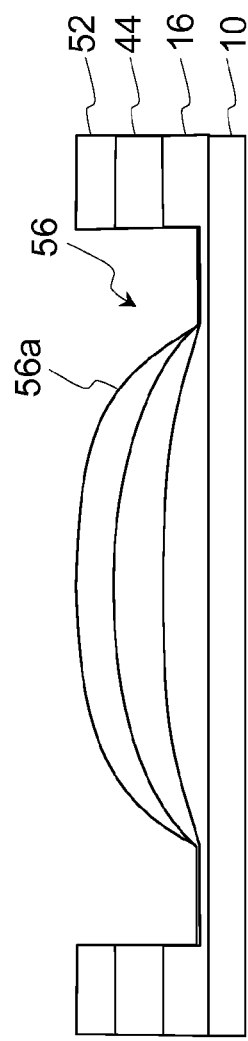
Figure 2K:
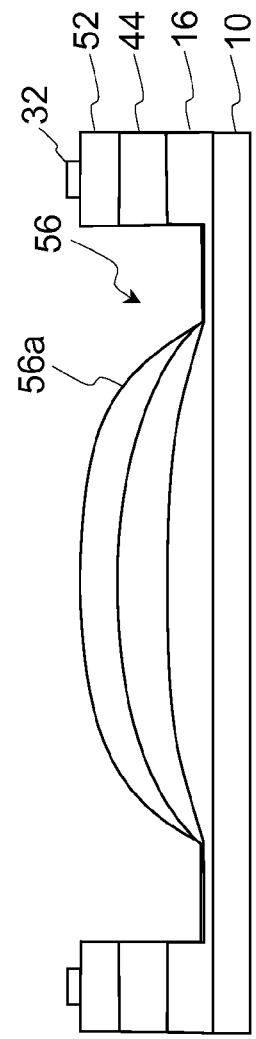
Figure 2L:
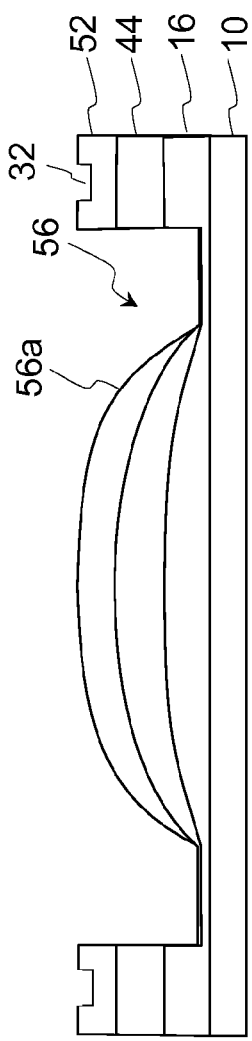
Figure 2M:
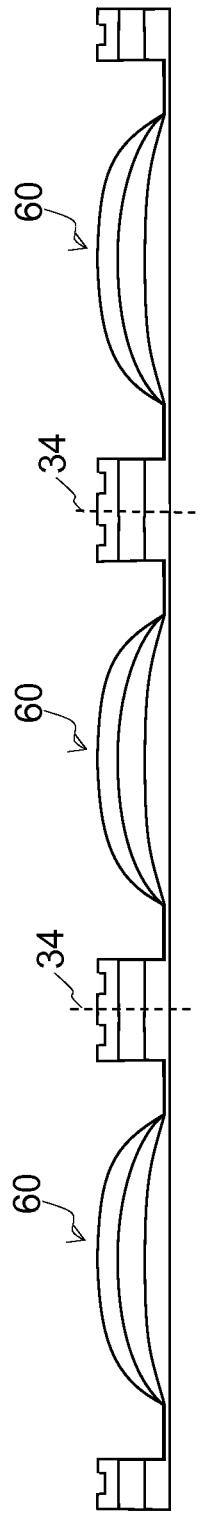
Figure 2N:
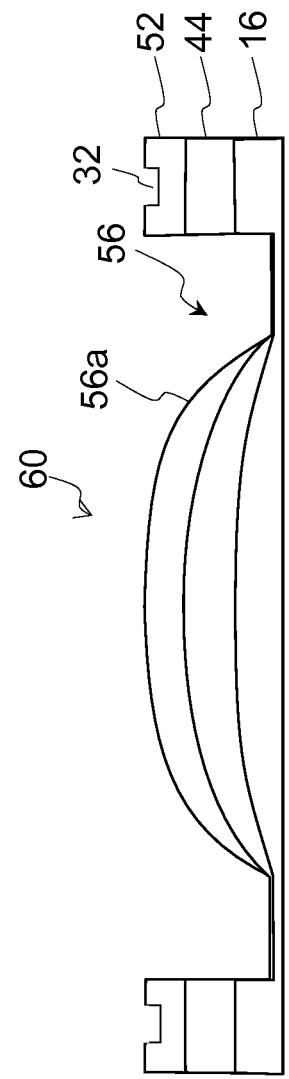

FIGS. 2A-2N illustrate the sequence of steps for manufacturing an alternate embodiment multi-layer lens. The process begins with the structure of FIG. 1B, except for the relative locations of the exposed portions of polymer layer 16, as illustrated in FIG. 2A. An anisotropic etch is then performed to selectively etch the exposed portions of polymer layer 16. For example, a plasma or wet anisotropic etching process removes portions of layer 16 to form an annular trench-shaped cavity 40 into the upper surface of layer 16 (i.e. in the form of a ring around the optical area). The photo-resist 18 is then removed, leaving the structure illustrated in FIG. 2B.

A photo-resist layer 42 is deposited over the structure (including inside cavity 40). A photolithography process is used to remove selective portions of photo-resist layer 42 (along the inner sidewall of cavity 40, and that portion on the upper surface of polymer layer 16 that is adjacent the inner sidewall of cavity 40), as illustrated in FIG. 2C. An isotropic etching process, such as a wet bath of polymer etch agent, is used to dissolve exposed portions of polymer layer 16, creating a curved shaped to the inner-sidewall 40a of cavity 40. The resulting structure is illustrated in FIG. 2D (after photo-resist 42 is removed). The curvature and angle of the inner-sidewall 40*a* of cavity 40 can be controlled by the thickness of polymer layer 16, the pattern of photo-resist 42 and the etch material.

A second polymer layer 44 is next formed over polymer layer 16 (filling cavity 40). Polymer layer 44 can be formed with the same material(s) or different material(s) (and same or different thickness) as polymer layer 16, depending upon the desired optical properties provided by itself and/or in combination of the other polymer layers. A photo-resist layer 46 is then formed over polymer layer 44, and patterned to expose portions of polymer layer 44, as illustrated in FIG. 2E.

An anisotropic etch is then performed to selectively etch the exposed portions of polymer layer 44. For example, a plasma or wet anisotropic etching process removes portions of layer 44 to form an annular trench-shaped cavity 48 into the upper surface of layer 44 (i.e. in the form of a ring around the optical area). After the photo-resist 46 is removed, a photo-resist layer 50 is deposited over the structure (including inside cavity 48). A photolithography process is used to remove selective portions of photo-resist layer 50 (along the inner sidewall of cavity 48, and that portion on the upper surface of polymer layer 44 that is adjacent the inner sidewall of cavity 48), as illustrated in FIG. 2F. An isotropic etching process, such as a wet bath of polymer etch agent, is used to dissolve exposed portions of polymer layer 44, creating a curved inner-sidewall 48*a* to cavity 48. The resulting structure is illustrated in FIG. 2G (after photo-resist 50 is removed). The curvature and angle of inner-sidewall 48*a* of cavity 48 can be controlled by the thickness of polymer layer 44, the pattern of photo-resist 50, and the etch material.

A third polymer layer 52 is next formed over polymer layer 44 (filling cavity 48). Polymer layer 52 can be formed with the same material(s) or different material(s) (and same or different thicknesses) as polymer layers 16 and 44, depending upon the desired optical properties provided by itself and/or in combination of the other polymer layers. A photo-resist layer 54 is then formed over polymer layer 52, and patterned to expose portions of polymer layer 52, as illustrated in FIG. 2H.

An anisotropic etch is then performed to selectively etch the exposed portions of polymer layer 52. For example, a plasma or wet anisotropic etching process removes portions of layer 52 to form an annular trench-shaped cavity 56 into the upper surface of layer 44 (i.e. in the form of a ring around the optical area). After the photo-resist 54 is removed, a photo-resist layer 58 is deposited over the structure (including inside cavity 56). A photolithography process is used to remove selective portions of photo-resist layer 56 (along the inner sidewall of cavity 56, and that portion on the upper surface of polymer layer 52 that is adjacent the inner sidewall of cavity 56), as illustrated in FIG. 2I. An isotropic etching process, such as a wet bath of polymer etch agent, is used to dissolve exposed portions of polymer layer 52, creating a curved inner-sidewall 56*a* to cavity 56. The resulting structure is illustrated in FIG. 2J (after photo-resist 58 is removed). The curvature and angle of the inner-sidewall 56*a* of cavity 56 can be controlled by the thickness of polymer layer 52, the pattern of photo-resist 58, and the etch material. Surface 56*a* defines the lens surface.

A soft isotropic etch can be performed to smooth out any roughness on surface 56*a*, as well as any steps or gaps between polymer layers 16/44/52. A similar surface polishing may be (i.e. optional) performed on the lens backside (i.e. the bottom surface of polymer layer 16 abutting carrier 10 after removal from the carrier 10).

Surface 56*a* can be optionally coated with an IR coating, and the back surface of polymer layer 16 (i.e. bottom surface of polymer layer 16 abutting the carrier 10) can be optionally coated with an AR coating, as described above. Alignment marks 32 can be formed on or in the top surface of polymer layer 52 as described above, and shown in FIGS. 2K and 2L. Alignment marks 32 could additionally or alternately be formed on or in the bottom surface of polymer layer 16.

The carrier 10 is then removed, and the structure is then diced along dicing lines 34 illustrated in FIG. 2M to separate each of the individual lenses 60. The final lens 60 is illustrated in FIG. 2N. In this embodiment, lens 60 is a substrate formed of discrete layers of polymer material. Not only can non-planar lens surface 56*a* be precisely shaped and formed to provide the desired focusing effects, but the abutting non-planar surfaces of discretely formed layers 16 and 44, and the abutting non-planar surfaces of discretely formed layers 44 and 52, can provide additional light focusing effects when the layers 16, 44 and/or 52 are formed of different materials with different light propagating properties (e.g. different effective indices of refraction).

Figure 3:
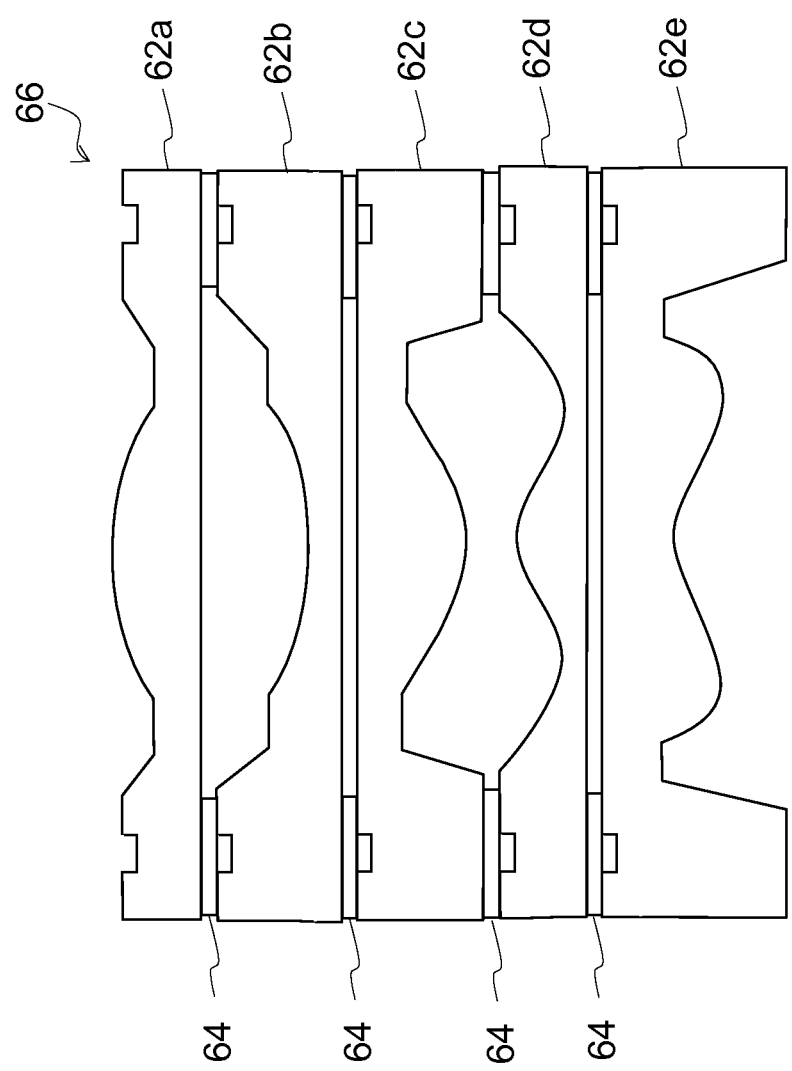
FIGS. 3-4 are cross sectional side views of a lens assembly of a plurality of stacked multi-layered lenses.

Lens assemblies can be formed by stacking a plurality of lenses of similar or dissimilar design to achieve the light focusing performance required for the particular application. For example, FIG. 3 illustrates five lenses 62*a*-62*e* stacked together using bonding material 64 to form a lens assembly 66. The number of lenses 62 and lens shapes can vary depending upon the performance requirements of the design. Bonding material 64 can be a polymer, epoxy based, a resin, a metal or any other appropriate bonding material. Preferably, epoxy based adhesive 64 is applied to the non-alignment mark side of lenses 62*a*-62*e*. A stacking tool with an alignment camera can be used to align the alignment marks 32 before bonding the lenses 62*a*-62*e* together.

Figure 4:
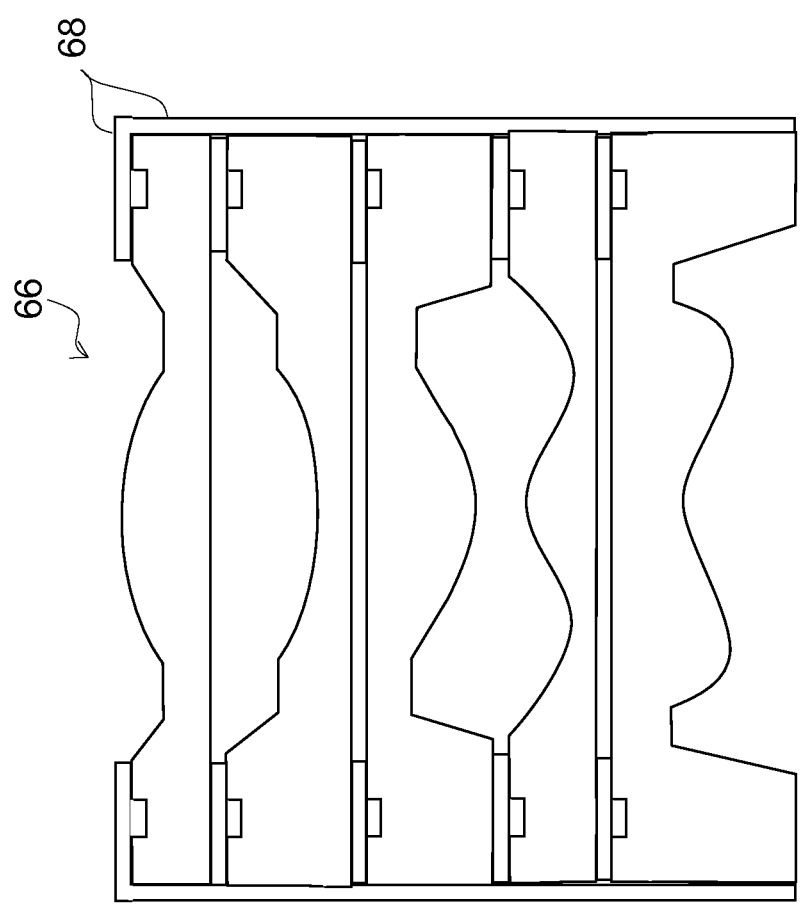

After completing the lens stacking and bonding process, a light shielding layer 68 is deposited on the lens stack sidewalls (i.e. extending around and between the outer edges of the lenses), as illustrated in FIG. 4 (i.e. for lenses having a round outer edge, layer 68 would be in the form of a cylinder). Light shielding layer 68 can be polymer, epoxy based, resin, paint, tape, metal, plastic/metallic enclosure or any other non-transparent material(s). Preferably, light shielding layer 68 is at least 5 μm in thickness and made of polymer based material such as black solder mask.

Figure 5:
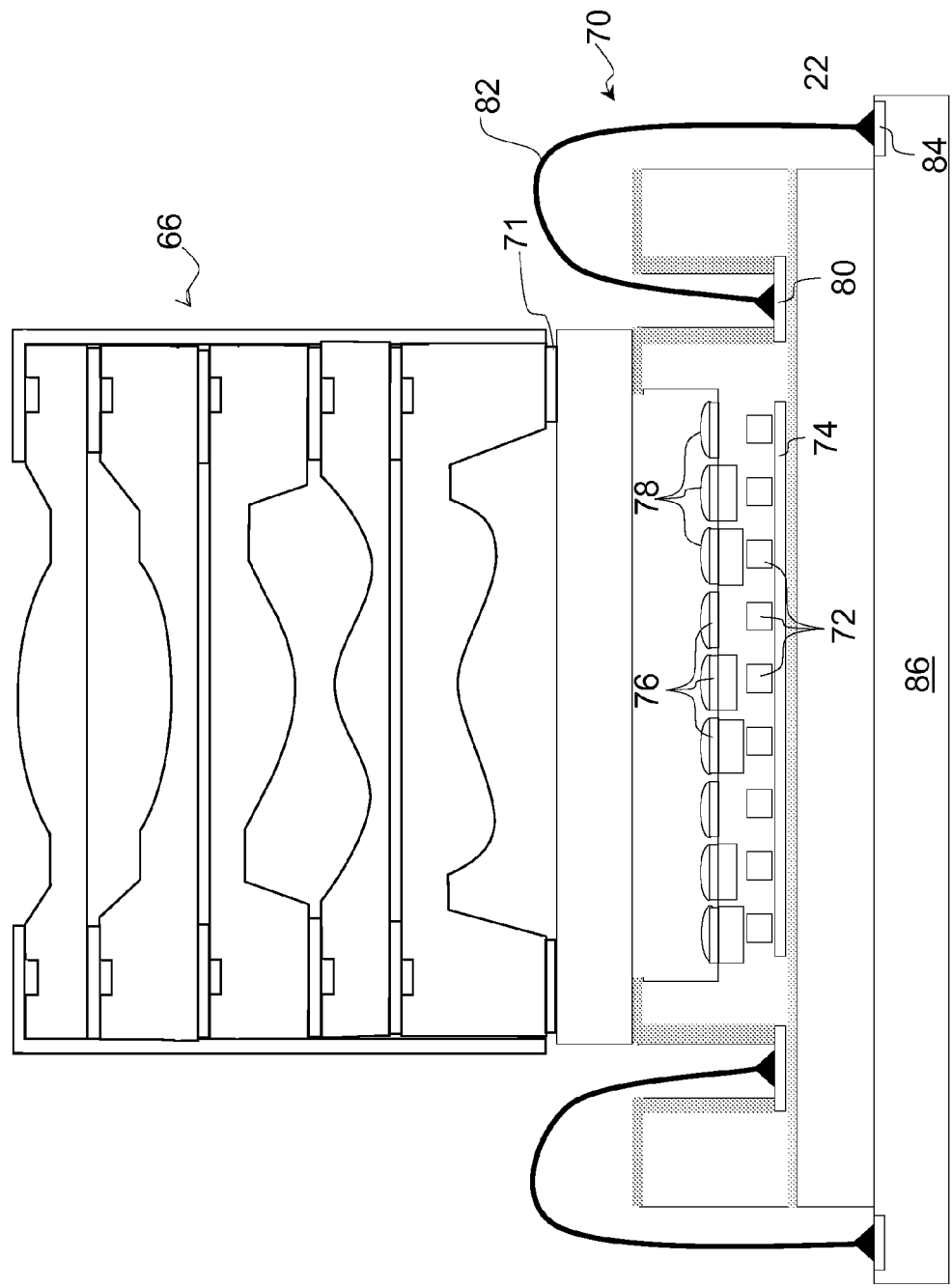
FIG. 5 is a cross sectional side view of the lens assembly (of a plurality of stacked multi-layered lenses) mounted on an image sensor assembly.

FIG. 5 illustrates the lens assembly 66 bonded to a CMOS image sensor assembly 70 via bond joints 71. Bond joints 71 can be a polymer, epoxy based, resin, metallic or any other bonding material. Preferably, bond joints 71 are an epoxy based adhesive that is deposited on the bottom side of lens module 66, where the lens module 66 is then picked up and placed on the CMOS image sensor assembly 70 for bonding. Image sensor assembly 70 generally includes photo detectors 72, circuitry 74, color filters 76, microlenses 78, contact pads 80, wires 82, contact pads 84 and a circuit board 86. A more detailed discussion of image sensor assembly 70 can be found in co-pending U.S. patent application Ser. No. 13/343,682, which is incorporated herein by reference for all purposes.

It is to be understood that the present invention is not limited to the embodiment(s) described above and illustrated herein, but encompasses any and all variations falling within the scope of the appended claims. For example, while lens 36/60 are shown and described with three polymer layers, they can contain N polymer layers, where N is any integer 2 or greater. References to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the multi-layer lens of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements, or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A lens, comprising:
a substrate having opposing first and second surfaces, wherein the substrate is formed of a plurality of discrete polymer layers; and
a cavity formed into the first surface and including a non-planar cavity surface in the substrate, wherein the cavity extends into each of the plurality of polymer layers.

2. The lens of claim 1, wherein a composition of one of the plurality of polymer layers varies from that of another of the plurality of polymer layers.

3. The lens of claim 1, wherein each of the plurality of polymer layers defines at least one portion of the non-planar cavity surface.

4. The lens of claim 1, further comprising:
a plurality of alignment marks formed at one of the first and second surfaces.

5. The lens of claim 4, wherein each of the plurality of alignment marks comprises a protrusion extending from the one first and second surface.

6. The lens of claim 4, wherein each of the plurality of alignment marks comprises a cavity formed into the one first and second surface.

7. A method of forming a lens, comprising:
forming a first polymer layer;
forming a first cavity into a top surface of the first polymer layer;
forming a second polymer layer on the top surface of the first polymer layer; and
forming a second cavity into a top surface of the second polymer layer that extends through the second polymer layer to the first cavity;
wherein the first and second cavities together include a non-planar cavity surface.

8. The method of claim 7, wherein a composition of the first polymer layer varies from that of the second polymer layer.

9. The method of claim 7, wherein each of the first and second polymer layers defines at least one portion of the non-planar cavity surface.

10. The method of claim 7, further comprising;
filling the first cavity with a material before the forming of the second polymer layer.

11. The method of claim 7, further comprising:
forming a plurality of alignment marks at the top surface of the second polymer layer or a bottom surface of the first polymer layer.

12. The lens of claim 11, wherein each of the plurality of alignment marks comprises at least one of a protrusion and a cavity.

13. The method of claim 7, further comprising:
forming a third polymer layer on the top surface of the second polymer layer; and
forming a third cavity into a top surface of the third polymer layer that extends through the third polymer layer to the second cavity;
wherein the first, second and third cavities together define the non-planar cavity surface.

14. The method of claim 13, wherein a composition of one of the first, second and third polymer layers varies from that of another of the first, second and third polymer layers.

15. The method of claim 13, wherein each of the first, second and third polymer layers defines at least one portion of the non-planar cavity surface.

16. The method of claim 13, further comprising;
filling the first cavity with a first material before the forming of the second polymer layer; and
filling the second cavity with a second material before the forming of the third polymer layer.

17. The method of claim 13, further comprising:
forming a plurality of alignment marks at the top surface of the third polymer layer or a bottom surface of the first polymer layer.

18. The lens of claim 17, wherein each of the plurality of alignment marks comprises at least one of a protrusion and a cavity.

19. A method of forming a lens, comprising:
forming a first polymer layer;
forming a first cavity into a top surface of the first polymer layer;
altering a shape of a sidewall of the first cavity;
forming a second polymer layer on the top surface of the first polymer layer;
forming a second cavity into a top surface of the second polymer layer; and
altering a shape of a sidewall of the second cavity;
wherein the second cavity includes a first non-planar cavity surface.

20. The method of claim 19, wherein a composition of the first polymer layer varies from that of the second polymer layer.

21. The method of claim 19, further comprising:
forming a plurality of alignment marks at the top surface of the second polymer layer or a bottom surface of the first polymer layer.

22. The lens of claim 21, wherein each of the plurality of alignment marks comprises at least one of a protrusion and a cavity.

23. The method of claim 19, further comprising:
forming a third polymer layer on the top surface of the second polymer layer;
forming a third cavity into a top surface of the third polymer layer; and
altering a shape of a sidewall of the third cavity;
wherein the third cavity includes a second non-planar cavity surface.

24. The method of claim 23, wherein a composition of one of the first, second and third polymer layers varies from that of another of the first, second and third polymer layers.

25. The method of claim 23, further comprising:
forming a plurality of alignment marks at the top surface of the third polymer layer or a bottom surface of the first polymer layer.

26. The lens of claim 25, wherein each of the plurality of alignment marks comprises at least one of a protrusion and a cavity.

27. A lens assembly, comprising:
a plurality of lenses each comprising:
a substrate having opposing first and second surfaces and an outer edge, wherein the substrate is formed of a plurality of discrete polymer layers, and
a cavity formed into the first surface and including a non-planar cavity surface in the substrate, wherein the cavity extends into each of the plurality of polymer layers;
wherein the plurality of lenses are stacked together such that adjacent ones of the plurality of lenses are affixed to each other by a bonding material; and
a layer of material that extends around and between the outer edges of the substrates.

28. The lens assembly of claim 27, wherein:
the outer edges of the substrates are round; and
the layer of material is cylindrical in shape.

29. The lens assembly of claim 27, wherein the layer of material is non-transparent.

30. The lens assembly of claim 27, wherein the non-planar cavity surface of one of the plurality of lenses has a shape that is different from that of the non-planar cavity surface of another of the plurality of lenses.

31. The lens assembly of claim 27, wherein for each of the plurality lenses, a composition of one of the plurality of polymer layers varies from that of another of the plurality of polymer layers.

32. The lens assembly of claim 27, wherein for each of the plurality lenses, each of the plurality of polymer layers defines at least one portion of the non-planar cavity surface.

* * * * *